(12) United States Patent
Priewasser (10) Patent No.: US 11,437,275 B2
(45) Date of Patent: Sep. 6, 2022

(54) METHOD OF PROCESSING WAFER AND PROTECTIVE SHEETING FOR USE IN THIS METHOD

(71) Applicant: Karl Heinz Priewasser, Munich (DE)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/755,425

(22) PCT Filed: Aug. 31, 2015

(86) PCT No.: PCT/EP2015/069854
§ 371 (c)(1),
(2) Date: Feb. 26, 2018

(87) PCT Pub. No.: WO2017/036512
PCT Pub. Date: Mar. 9, 2017

(65) Prior Publication Data
US 2018/0247870 A1    Aug. 30, 2018

(51) Int. Cl.
*H01L 21/78* (2006.01)
*H01L 21/683* (2006.01)

(52) U.S. Cl.
CPC .......... *H01L 21/78* (2013.01); *H01L 21/6836* (2013.01); *H01L 2221/6834* (2013.01); *H01L 2221/68327* (2013.01)

(58) Field of Classification Search
CPC ......... H01L 21/78–786; H01L 21/6836; H01L 21/6875
See application file for complete search history.

(56) References Cited

U.S. PATENT DOCUMENTS

| 6,348,741 B1 | 2/2002 | Ogino et al. |
| 6,376,278 B1* | 4/2002 | Egawa .................... H01L 21/56 438/110 |
| 2006/0102987 A1* | 5/2006 | Saiki ................. H01L 21/67282 257/632 |

(Continued)

FOREIGN PATENT DOCUMENTS

| CN | 103128440 A | 6/2013 |
| CN | 103295969 A | 9/2013 |

(Continued)

OTHER PUBLICATIONS

Int'l. Search report and written opinion issued in Int'l. App. No. PCT/EP2015/069854, dated May 13, 2016.

*Primary Examiner* — Julio J Maldonado
*Assistant Examiner* — Stanetta D Isaac
(74) *Attorney, Agent, or Firm* — Greer Burns & Crain Ltd.

(57) ABSTRACT

A wafer has on one side a device area with a plurality of devices, partitioned by a plurality of division lines, and a peripheral marginal area formed around the device area. The device area is formed with a plurality of protrusions protruding from a plane surface of the wafer. The wafer is processed by providing a protective film, having a cushioning layer applied to a front surface thereof, attaching a front surface of the protective film, for covering the devices, wherein the protective film is adhered to at least the peripheral marginal area with an adhesive, and attaching a back surface of the protective film opposite to the front surface thereof to the cushioning layer. The protrusions are embedded in the cushioning. The side of the wafer opposite to the one side is ground for adjusting the wafer thickness.

19 Claims, 5 Drawing Sheets

(56) References Cited

U.S. PATENT DOCUMENTS

| | | | |
|---|---|---|---|
| 2006/0148212 A1* | 7/2006 | Fukuyo | H01L 21/78 438/463 |
| 2007/0232030 A1 | 10/2007 | Kumagai | |
| 2010/0233868 A1* | 9/2010 | Maeda | H01L 21/6835 438/464 |
| 2010/0255299 A1 | 10/2010 | Kawashima et al. | |
| 2011/0048615 A1 | 3/2011 | Fukaya et al. | |
| 2013/0230964 A1* | 9/2013 | Imai | H01L 21/76 438/401 |
| 2014/0084423 A1 | 3/2014 | Priewasser | |
| 2014/0210075 A1 | 7/2014 | Lee et al. | |
| 2014/0264762 A1* | 9/2014 | Rajoo | H01L 23/10 257/618 |
| 2014/0295646 A1* | 10/2014 | Shinoda | H01L 21/6836 438/464 |
| 2015/0031215 A1 | 1/2015 | Mahoney et al. | |
| 2016/0218077 A1 | 7/2016 | Azuma et al. | |

FOREIGN PATENT DOCUMENTS

| | | |
|---|---|---|
| CN | 103700584 A | 4/2014 |
| CN | 105097483 A | 11/2015 |
| JP | 2001203255 A | 7/2001 |
| JP | 2002145380 A | 5/2002 |
| JP | 2003064329 A | 3/2003 |
| JP | 2006335787 A | 12/2006 |
| JP | 2011054635 A | 3/2011 |
| JP | 2011054827 A | 3/2011 |
| JP | 2011151163 A | 8/2011 |
| JP | 2012079910 A | 4/2012 |
| JP | 2012079911 A | 4/2012 |
| JP | 2013211439 A | 10/2013 |
| JP | 2013236098 A | 11/2013 |
| JP | 6312343 B2 | 3/2018 |
| KR | 1019980034139 A | 8/1998 |
| KR | 1020140095822 A | 7/2014 |
| WO | 2015046529 A1 | 4/2015 |

* cited by examiner

METHOD OF PROCESSING WAFER AND PROTECTIVE SHEETING FOR USE IN THIS METHOD

This is a National Phase Application filed under 35 U.S.C. § 371, of International Application No. PCT/EP2015/069854, filed Aug. 31, 2015, the contents of which are incorporated by reference.

TECHNICAL FIELD

The present invention relates to a method of processing a wafer, such as a semiconductor wafer, having on one side a device area with a plurality of devices, partitioned by a plurality of division lines, and a peripheral marginal area having no devices and being formed around the device area, wherein the device area is formed with a plurality of protrusions protruding from a plane surface of the wafer. Further, the present invention relates to a protective sheeting for use in such a method.

TECHNICAL BACKGROUND

In a semiconductor device fabrication process, a wafer having a device area with a plurality of devices partitioned by a plurality of division lines is divided into individual dies or chips. This fabrication process generally comprises a grinding step for adjusting the wafer thickness and a cutting step of cutting the wafer along the division lines to obtain the individual dies or chips. The grinding step is performed from a back side of the wafer which is opposite to a wafer front side on which the device area is formed.

In known semiconductor device fabrication processes, such as Wafer Level Chip Scale Package (WLCSP), the device area of the wafer is formed with a plurality of protrusions, such as bumps, protruding from a plane surface of the wafer. These protrusions are used, for example, for establishing an electrical contact with the devices in the individual dies or chips, e.g., when incorporating the dies or chips in electronic equipment, such as mobile phones and personal computers.

In order to achieve a size reduction of such electronic equipment, the semiconductor devices have to be reduced in size. Hence, wafers having the devices formed thereon are ground in the grinding step referred to above to thicknesses in the μm range, e.g., in the range from 30 to 100 μm.

However, in known semiconductor device fabrication processes, problems may arise in the grinding step if protrusions, such as bumps, protruding from a plane surface of the wafer are present in the device area. Specifically, due to the presence of these protrusions, the risk of breakage of the wafer during grinding is significantly increased. Further, if the wafer is ground to a small thickness, e.g., a thickness in the μm range, the protrusions of the device area on the front side of the wafer may cause a deformation of the wafer back side, due to the reduced thickness of the wafer and the pressure applied thereto in the grinding process. This latter effect is referred to as "pattern transfer", since the pattern of the protrusions on the wafer front side is transferred to the wafer back side, and results in an undesired unevenness of the back side surface of the wafer, thus compromising the quality of the resulting dies or chips.

Moreover, the presence of the protrusions in the device area of the wafer also significantly increases the risk of damage to the wafer in the cutting step referred to above. In particular, due to the reduced wafer thickness after grinding, the sidewalls of the dies or chips may crack in the cutting process, thus severely damaging the resulting dies or chips.

Hence, there remains a need for a reliable and efficient method of processing a wafer having a device area with protrusions formed on one side thereof which allows for any risk of damage to the wafer to be minimised.

SUMMARY OF THE INVENTION

Accordingly, it is an object of the present invention to provide a reliable and efficient method of processing a wafer having a device area with protrusions formed on one side thereof which allows for any risk of damage to the wafer to be minimised. Further, the invention aims to provide a protective sheeting for use in such a method. These goals are achieved by a wafer processing method with the technical features of claim 1 and a protective sheeting with the technical features of claim 15. Preferred embodiments of the invention follow from the dependent claims.

The invention provides a method of processing a wafer, having on one side a device area with a plurality of devices, partitioned by a plurality of division lines, and a peripheral marginal area having no devices and being formed around the device area, wherein the device area is formed with a plurality of protrusions or projections protruding, extending or projecting from a plane surface of the wafer. The method comprises providing a protective film, providing a base sheet having a cushioning layer applied to a front surface thereof, attaching a front surface of the protective film, for covering the devices on the wafer, to the one side of the wafer, wherein the protective film is adhered to at least the peripheral marginal area with an adhesive, and attaching a back surface of the protective film opposite to the front surface thereof to the cushioning layer. The protrusions protruding from the plane surface of the wafer are embedded in the cushioning layer and a back surface of the base sheet opposite to the front surface thereof is substantially parallel to the side of the wafer being opposite to the one side. The method further comprises grinding the side of the wafer being opposite to the one side for adjusting the wafer thickness.

The protrusions or projections, such as bumps, protrude, extend or project from a plane surface of the wafer which is a substantially flat surface. The protrusions or projections define a surface structure or topography of the one side of the wafer, rendering this one side uneven.

The protrusions may be irregularly arranged or arranged in a regular pattern. Only some of the protrusions may be arranged in a regular pattern.

The protrusions may have any type of shape. For example, some or all of the protrusions may be in the shape of spheres, semi-spheres, pillars or columns, e.g., pillars or columns with a circular, elliptic or polygonal, such as triangular, square etc., cross-section or base area, cones, truncated cones or steps.

At least some of the protrusions may arise from elements formed on the plane surface of the wafer. At least some of the protrusions may arise from elements partly or entirely penetrating the wafer in its thickness direction, e.g., for the case of a through silicon via (TSV). These latter elements may extend along part of the wafer thickness or along the entire wafer thickness.

The protrusions may have a height in the thickness direction of the wafer in the range of 20 to 300 μm, preferably 40 to 250 μm, more preferably 50 to 200 μm and even more preferably 70 to 150 μm.

All the protrusions may have substantially the same shape and/or size. Alternatively, at least some of the protrusions may differ from each other in shape and/or size.

The back surface of the protective film is attached to a surface of the cushioning layer which is opposite to the surface of the cushioning layer which is in contact with the base sheet.

According to the wafer processing method of the present invention, the front surface of the protective film is attached to the one side of the wafer, i.e., the wafer front side, and the back surface of the protective film is attached to the cushioning layer applied to the front surface of the base sheet, so that the protrusions protruding from the plane surface of the wafer are embedded in the cushioning layer and the back surface of the base sheet is substantially parallel to the side of the wafer being opposite to the one side. In this way, a wafer unit comprising the wafer, the protective film and the base sheet with the cushioning layer applied thereto is formed, which allows for any negative influence of the surface unevenness arising from the presence of the protrusions in the device area on subsequent wafer processing steps to be eliminated.

In particular, by embedding the protrusions in the cushioning layer applied to the front surface of the base sheet, the protrusions are reliably protected from any damage during wafer processing, for example, in subsequent grinding and cutting steps.

Further, the back surface of the base sheet, which forms a first surface of the wafer unit referred to above, and the back side of the wafer, which forms a second surface of this wafer unit, are substantially parallel to each other. Hence, when grinding the back side of the wafer for adjusting the wafer thickness, a suitable counter pressure can be applied to the back surface of the base sheet, e.g., by placing this back surface on a chuck table.

Since the plane back surface of the base sheet is substantially parallel to the back side of the wafer, the pressure applied to the wafer during the grinding process, e.g., by a grinding wheel of a grinding apparatus, is evenly and homogenously distributed over the wafer, thus minimising any risk of a pattern transfer, i.e., a transfer of the pattern defined by the protrusions in the device area to the ground wafer back side, and breakage of the wafer. Further, the substantially parallel alignment of the flat, even back surface of the base sheet and the back side of the wafer allows for the grinding step to be carried out with a high degree of precision, thus achieving a particularly uniform and homogenous wafer thickness after grinding.

The protective film covers the devices formed in the device area of the wafer, therefore protecting the devices from damage and contamination. Moreover, the protective film facilitates removal of the base sheet with the cushioning layer from the wafer after processing. Also, the protective film acts as a further cushion or buffer between the wafer front side and the cushioning layer, thus further contributing to the uniform and homogeneous distribution of pressure during grinding. Hence, a pattern transfer or breakage of the wafer during the grinding process can be particularly reliably prevented.

In this regard, it is particularly preferable that the protective film is compressible, elastic, flexible and/or pliable. In this way, the cushioning or buffering effect of the protective film can be further enhanced.

Therefore, the wafer processing method of the present invention allows for the risk of any damage to the wafer, such as a pattern transfer or wafer breakage, to be minimised in a reliable and efficient way.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an InAs wafer, an InP wafer, a SiC wafer, a SiN wafer, a LT (lithium tantalate) wafer, a LN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

In the method of the invention, the protective film and the base sheet, having the cushioning layer applied to the front surface thereof, may be laminated first, forming a protective sheeting comprising the base sheet, the cushioning layer and the protective film attached to the cushioning layer. The protective sheeting formed in this manner may be subsequently attached to the one side of the wafer, such that the protrusions protruding from the plane surface of the wafer are covered by the protective film and embedded in the cushioning layer, and the back surface of the base sheet is substantially parallel to the side of the wafer being opposite to the one side. In this case, the front surface of the protective film is attached to the one side of the wafer when the protective sheeting is attached to the one side of the wafer.

In this way, the wafer processing method can be carried out in a particularly simple and efficient manner. For example, the protective sheeting can be prepared in advance, stored for later use and used for the wafer processing when required. The protective sheeting may thus be manufactured in large quantities, rendering the production thereof particularly efficient in terms of both time and cost.

Alternatively, the protective film may be attached to the one side of the wafer first, and the one side of the wafer, having the protective film attached thereto, may be subsequently attached to the front surface of the base sheet, so that the protrusions protruding from the plane surface of the wafer are embedded in the cushioning layer and the back surface of the base sheet is substantially parallel to the side of the wafer being opposite to the one side. In this case, the protective film can be attached to the one side of the wafer with a particularly high degree of accuracy, in particular, in relation to the protrusions protruding from the plane surface of the wafer.

The method may further comprise cutting the wafer along the division lines. The wafer may be cut from the front side or the back side thereof.

The cutting may be performed by mechanical cutting, e.g., by blade dicing or sawing, and/or by laser cutting and/or by plasma cutting. The wafer may be cut in a single mechanical cutting step, a single laser cutting step or a single plasma cutting step. Alternatively, the wafer may be cut by a sequence of mechanical cutting and/or laser cutting and/or plasma cutting steps.

The cutting of the wafer may be performed in a state in which the protective film and the base sheet with the cushioning layer are attached to the wafer. In this way, it can be ensured that the pressure applied during the cutting step is uniformly and homogenously distributed throughout the wafer during cutting, thus minimising any risk of damage to the wafer, e.g., cracking of the sidewalls of the resulting dies or chips, in the cutting step. In this case, it is particularly preferred that the wafer be cut from the back side thereof.

The method may further comprise removing the protective film, the cushioning layer and the base sheet from the wafer. For example, the protective film, the cushioning layer and the base sheet may be removed from the wafer after grinding, e.g., after grinding but before cutting, or after grinding and cutting. In this way, the individual dies can be separated and picked up in a simple and reliable manner. For instance, if the protective film, the cushioning layer and the base sheet are provided in the form of the protective sheeting described above, the protective sheeting may be removed from the wafer after grinding or after grinding and cutting.

In one embodiment, the base sheet, the cushioning layer and the protective film may be removed individually, i.e., one after the other. Further, the base sheet and the cushioning layer may be removed together first, followed by the removal of the protective film. Alternatively, the base sheet may be removed first, followed by removing the cushioning layer and the protective film together.

The cutting of the wafer may be performed before removing the protective film, the cushioning layer and the base sheet from the wafer. In this case, the wafer is safely protected by the protective film, the cushioning layer and the base sheet in the cutting process. Hence, any damage to the wafer during cutting can be particularly reliably avoided.

Alternatively, the cutting of the wafer may be performed after removing the protective film, the cushioning layer and the base sheet from the wafer. This approach allows for the individual dies to be separated and picked up immediately after the cutting step. In this case, it is particularly preferable to perform the cutting step from the front side of the wafer.

The adhesive for adhering the protective film to the one side of the wafer may be provided only in the peripheral marginal area of the wafer. In this way, it can be particularly reliably ensured that no adhesive residues remain in the device area after removal of the protective film. Further, by providing the adhesive only in the peripheral marginal area, the area in which protective film and wafer are attached to each other is significantly reduced. Thus, the protective film can be detached from the wafer more easily and the risk of damage to the wafer, in particular, the protrusions formed in the device area thereof, is further reduced.

Moreover, if the adhesive is treated, e.g., cured, for allowing easier detachment of the protective film, the devices are protected from damage in the treatment process, since they are located spaced apart from the area where the adhesive is present.

For example, the adhesive may be provided in the peripheral marginal area in an annular arrangement.

Alternatively, the adhesive may be provided over an entire contact area of the one side of the wafer and the protective film. In this way, it can be ensured that the protective film is particularly reliably held in place on the one side of the wafer. Further, after cutting of the wafer, the resulting separated dies can be securely held by the protective film, thus preventing any undesired shift or movement of the dies or chips.

In particular, the adhesive may be provided over an entire surface of the protective film which is in contact with the one side of the wafer.

The adhesive may be curable by an external stimulus, such as heat, UV radiation, an electric field and/or a chemical agent. In this way, the protective film can be particularly easily removed from the wafer after processing. The external stimulus may be applied to the adhesive so as to lower the adhesive force thereof, thus allowing for an easy removal of the protective film.

The step of attaching the protective film to the one side of the wafer may be carried out in a vacuum chamber. In particular, the protective film may be attached to the one side of the wafer by using a vacuum laminator. In such a vacuum laminator, the wafer is placed on a chuck table in a vacuum chamber in a state in which the wafer back side is in contact with an upper surface of the chuck table and the wafer front side is oriented upward. The protective film to be attached to the wafer front side is held at its peripheral portion by an annular frame and placed above the wafer front side in the vacuum chamber. An upper part of the vacuum chamber which is situated above the chuck table and the annular frame is provided with an air inlet port closed by an expandable rubber membrane.

After the wafer and the protective film have been loaded into the vacuum chamber, the chamber is evacuated and air is supplied through the air inlet port to the rubber membrane, causing the rubber membrane to expand into the evacuated chamber. In this way, the rubber membrane is moved downward in the vacuum chamber so as to push the protective film against the wafer front side, sealing the peripheral wafer portion with the protective film and pressing the film against the device area on the wafer front side. Hence, the protective film can be attached closely to the wafer front side, so as to follow the contours of the protrusions in the device area.

Subsequently, the vacuum in the vacuum chamber is released and the protective film is held in position on the wafer front side by the adhesive and the positive pressure in the vacuum chamber.

Alternatively, the rubber membrane can be replaced by a soft stamp or a soft roller.

The protective film may be attached to the one side of the wafer so that the film only partially follows the contours of the protrusions. For example, the protective film may follow only upper portions of the protrusions in the thickness direction of the wafer. Such an arrangement of the protective film may allow for a particularly easy removal of the base sheet with the cushioning layer applied thereto and the protective film from the wafer.

Alternatively, the protective film may be attached to the wafer front side so as to closely follow the contours of the protrusions. In this way, the protrusions with the protective film attached thereto can be particularly reliably embedded in the cushioning layer.

The protective film may be expandable. The protective film may be expanded when being attached to the one side of the wafer, so as to follow the contours of the protrusions protruding from the plane surface of the wafer.

In particular, the protective film may be expandable to twice its original size or more, preferably three times its original size or more and more preferably four times its original size or more. In this way, in particular, for the case of an expansion to three or four times its original size or more, it can be reliably ensured that the protective film closely follows the contours of the protrusions.

The cushioning layer may be formed of any type of material which allows for the protrusions protruding from the plane surface of the wafer to be embedded therein. For example, the cushioning layer may be formed of a resin, an adhesive, a gel or the like.

The cushioning layer may be curable by an external stimulus, such as UV radiation, heat, an electric field and/or a chemical agent. In this case, the cushioning layer hardens at least to some degree upon application of the external stimulus thereto. For example, the cushioning layer may be formed of a curable resin, a curable adhesive, a curable gel or the like.

The cushioning layer may be configured so as to exhibit a degree of compressibility, elasticity and/or flexibility after curing thereof, i.e., to be compressible, elastic and/or flexible after curing. For example, the cushioning layer may be such that it is brought into a rubber-like state by curing. Alternatively, the cushioning layer may be configured so as to reach a rigid, hard state after curing.

Preferred examples of UV curable resins for use as the cushioning layer in the processing method of the invention are ResiFlat by the DISCO Corporation and TEMPLOC by DENKA.

The method may further comprise applying the external stimulus to the cushioning layer so as to cure the cushioning layer, before grinding the side of the wafer being opposite to the one side, i.e., the wafer back side. In this way, the protection of the wafer during grinding and the grinding accuracy can be further improved.

The protective film facilitates removal of the base sheet with the curable or cured cushioning layer applied thereto from the wafer. In particular, due to the presence of the protective film, the base sheet with the cushioning layer can be removed from the wafer in a reliable and simple manner, avoiding any residues, such as resin, adhesive or gel residues, in the device area, thus preventing contamination of the devices, and minimising the risk of damaging the protrusions in the removal process.

The base sheet with the cured cushioning layer can be removed after curing in a particularly reliable and efficient manner if the curable cushioning layer exhibits a degree of compressibility, elasticity and/or flexibility, i.e., is compressible, elastic and/or flexible, for example, rubber-like, after curing.

If the cushioning layer is configured so as to reach a rigid, hard state upon curing, removal of the base sheet and the cushioning layer from the wafer may be facilitated by applying an external stimulus to the cured cushioning layer, softening or removing the cushioning layer at least to some extent. For example, some cushioning layers, e.g., formed of the UV curable resin TEMPLOC by DENKA, may be treated by applying hot water thereto after curing, in order to soften the cured cushioning layer and allow for a particularly easy removal of the base sheet and the cushioning layer from the wafer.

The method of the invention may further comprise cutting off a portion or portions of the protective film and/or the cushioning layer, e.g., the curable or cured cushioning layer, and/or the base sheet which laterally extends or extend beyond a circumference of the wafer, before grinding the side of the wafer being opposite to the one side. In this way, handling the wafer unit, comprising the wafer, the protective film and the base sheet with the cushioning layer applied thereto, during grinding and in possible subsequent processing steps, such as cutting, is further facilitated.

The material of the base sheet is not particularly limited. The base sheet may be made of a soft or pliable material, such as, for example, a polymer material, e.g., polyvinyl chloride (PVC) or ethylene vinyl acetate (EVA).

Alternatively, the base sheet may be made of a rigid or hard material, such as PET and/or silicon and/or glass and/or SUS.

For example, if the base sheet is made of PET or glass and the cushioning layer is curable by an external stimulus, the cushioning layer may be cured with radiation that is transmittable through PET or glass, for instance UV radiation. If the base sheet is made of silicon or SUS, a cost-efficient base sheet is provided.

Also, the base sheet may be formed of a combination of the materials listed above.

The base sheet may have a thickness in the range of 200 to 1500 µm, preferably 400 to 1200 µm and more preferably 500 to 1000 µm.

The protective film may have a thickness in the range of 5 to 200 µm, preferably 8 to 100 µm, more preferably 10 to 80 µm and even more preferably 12 to 50 µm. In this way, it can be ensured that the protective film is flexible and pliable enough to sufficiently conform to the contours of the protrusions in the device area and, at the same time, exhibits a sufficient thickness in order to reliably and efficiently provide the cushioning or buffering effect described above.

The protective film may be made of a polymer material, such as polyvinyl chloride (PVC) or ethylene vinyl acetate (EVA). For example, the protective film may be a "Saran" wrap-like material.

The diameter of the protective film in the attached state thereof may be approximately the same as the diameter of the wafer.

The cushioning layer may have a thickness in the range of 20 to 300 µm, preferably 50 to 250 µm and more preferably 80 to 200 µm.

The invention further provides a protective sheeting for use in processing a wafer, in particular, for use in the method of processing a wafer of the invention described above.

The protective sheeting of the invention comprises a base sheet, a cushioning layer applied to a front surface of the base sheet, a protective film, a back surface of which is attached to the cushioning layer, and an adhesive layer applied to at least part of a front surface of the protective film opposite to the back surface thereof.

The features described above for the processing method of the invention also apply to the protective sheeting of the invention.

The protective sheeting of the invention is a protective sheeting for use in the method of processing a wafer of the invention. In particular, the protective sheeting is configured to be attached to the one side of the wafer, such that the protrusions protruding from the plane surface of the wafer are covered by the protective film and embedded in the cushioning layer, and the back surface of the base sheet is substantially parallel to the side of the wafer being opposite to the one side.

Hence, the protective sheeting of the invention provides the technical effects and advantages already described in detail above for the processing method of the invention.

The cushioning layer may be curable by an external stimulus, such as UV radiation, heat, an electric field and/or a chemical agent, as has been explained in detail above.

The adhesive layer may have a substantially annular shape. The adhesive layer may be provided only in a circumferential or peripheral portion of the front surface of the protective film.

In this way, it can be ensured that the adhesive is provided only in the peripheral marginal area of the wafer. Thus, it can be particularly reliably ensured that no adhesive residues remain in the device area after removal of the protective film. Further, the area in which protective film and wafer are attached to each other is significantly reduced. Hence, the protective sheeting can be detached from the wafer more easily and the risk of damage to the wafer, in particular, the protrusions formed in the device area thereof, is further reduced.

Moreover, if the adhesive is treated for allowing easier detachment of the protective film, e.g., by curing thereof, the devices are protected from damage in the treatment process, for example, due to the application of an external stimulus, since they are located spaced apart from the area where the adhesive is present.

Alternatively, the adhesive may be provided substantially over the entire front surface of the protective film. In this way, it can be ensured that the protective film is particularly reliably held in place on the one side of the wafer. Moreover, after cutting of the wafer, the resulting separated dies or chips can be securely held by the protective sheeting, thus preventing any undesired shift or movement of the dies or chips.

The adhesive may be provided over an entire contact surface of the protective film which is configured to be brought into contact with the one side of the wafer.

The inner diameter of the annular or substantially annular adhesive layer may be smaller than the diameter of a semiconductor-sized wafer, e.g., a semiconductor wafer.

Herein, the term "substantially annular" defines that the shape of the adhesive layer may deviate from a perfect annulus, e.g., due to the presence of one or more flat or straight portions, notches and/or grooves. The inner peripheral or circumferential shape of the adhesive layer may correspond to the outer peripheral or circumferential shape of the semiconductor-sized wafer.

Further, herein, the term "semiconductor-sized wafer" refers to a wafer with the dimensions (standardised dimensions), in particular, the diameter (standardised diameter), i.e., outer diameter, of a semiconductor wafer. The dimensions, in particular, the diameters, i.e., outer diameters, of semiconductor wafers are defined in the SEMI standards. For example, the semiconductor-sized wafer may be a Si wafer. The dimensions of polished single crystal Si wafers are defined in the SEMI standards M1 and M76. The semiconductor-sized wafer may be a 3 inch, 4 inch, 5 inch, 6 inch, 8 inch, 12 inch or 18 inch wafer.

The outer diameter of the substantially annular or annular adhesive layer may be larger than the diameter of the semiconductor-sized wafer.

The outer diameter of the substantially annular or annular adhesive layer may be larger than the inner diameter of a semiconductor-sized annular frame for holding a semiconductor-sized wafer.

Herein, the term "semiconductor-sized annular frame" refers to an annular frame with the dimensions (standardised dimensions), in particular, the inner diameter (standardised inner diameter), of an annular frame for holding a semiconductor wafer.

The dimensions, in particular, the inner diameters, of annular frames for holding semiconductor wafers are also defined in the SEMI standards. For example, the dimensions of tape frames for 300 mm wafers are defined in SEMI standard SEMI G74 and the dimensions of plastic tape frames for 300 mm wafers are defined in SEMI standard SEMI G87. The annular frames may have frame sizes for holding semiconductor-sized wafers with sizes of, for example, 3 inch, 4 inch, 5 inch, 6 inch, 8 inch, 12 inch or 18 inch.

By providing the substantially annular or annular adhesive layer so that the outer diameter thereof is larger than the inner diameter of the semiconductor-sized annular frame for holding the semiconductor-sized wafer, the protective sheeting can be attached to the annular frame via the adhesive layer so that an outer peripheral portion of the adhesive layer adheres to an inner peripheral portion of the annular frame.

In this way, a central opening of the annular frame, i.e., the area inside the inner diameter of the annular frame, can be closed by the protective sheeting. Thus, the protective sheeting can be securely attached to the annular frame.

Therefore, a single protective sheeting can be used for both holding and protecting the wafer and attaching the wafer to the annular frame, thus reducing the number of necessary equipment components and processing steps.

The inner diameter of the adhesive layer may be substantially the same as or larger than the outer diameter of the device area of the wafer. In this way, any damage or contamination of the devices formed in the device area can be particularly reliably prevented.

The base sheet may have a substantially circular or circular shape. The diameter of the base sheet may be substantially the same as the diameter of a semiconductor-sized wafer.

Herein, the term "substantially circular" defines a shape whose peripheral or circumferential form may deviate from a perfect circle, e.g., due to the provision of one or more flat or straight portions, notches and/or grooves. The substantially circular shape of the base sheet may correspond to the peripheral or circumferential shape of the semiconductor-sized wafer. The outer circumference of the semiconductor-sized wafer may have one or more flat or straight portions. The outer circumference of the wafer may have a notch or groove, for example, for indicating the crystal orientation of the wafer.

The diameter of the substantially circular or circular base sheet may be substantially the same as the outer diameter of the substantially annular or annular adhesive layer. In this way, a particularly efficient use of resources can be ensured.

The inner diameter of the adhesive layer may be smaller than the diameter of the wafer by 0.5 to 3.5 mm, preferably by 1.0 to 3.0 mm and more preferably by 1.5 to 2.5 mm. The peripheral marginal area or edge exclusion of a wafer, in which no devices are formed, commonly has a width of about 2 to 3 mm from the wafer edge. Thus, by choosing the inner diameter of the adhesive layer as specified above, it can be ensured that the adhesive layer does not interfere with the devices formed on the wafer.

The outer diameter of the adhesive layer may be in the range from 105 to 575 mm. The inner diameter of the adhesive layer may be in the range from 45 to 445 mm.

The outer diameter of the adhesive layer may be larger than the inner diameter of the adhesive layer by 30 to 100 mm, preferably by 40 to 70 mm. In this way, the protective sheeting can be attached particularly reliably to both the wafer and the annular frame.

The base sheet may be formed of a single material or of a combination of different materials. For example, the base sheet may be formed of polyvinyl chloride (PVC), polyolefin (PO), polyethylene terephthalate (PET), Kapton or the like or of a combination of two or more of these materials. These materials allow for the protective sheeting to be provided in a robust and lightweight form.

The adhesive layer may have a thickness in the range of 5 to 200 μm, preferably 10 to 150 μm and even more preferably 20 to 100 μm.

BRIEF DESCRIPTION OF THE DRAWINGS

Hereinafter, non-limiting examples of the invention are explained with reference to the drawings, in which.

DETAILED DESCRIPTION OF PREFERRED EMBODIMENTS

Preferred embodiments of the present invention will now be described with reference to the accompanying drawings. The preferred embodiments relate to methods for processing a wafer W and to protective sheetings for use in these methods.

The wafer W can be, for example, a MEMS wafer having MEMS devices formed on a front side surface thereof, which is called a pattern side 1 in the following description. However, the wafer W is not limited to a MEMS wafer, but may also be a CMOS wafer having CMOS devices, preferably as solid-state imaging devices, formed on the pattern side 1 thereof or a wafer with other types of devices on the pattern side 1.

The wafer W may be made of a semiconductor, e.g., silicon. Such a silicon wafer W can include devices, such as ICs (integrated circuits) and LSIs (large scale integrations), on a silicon substrate. Alternatively, the wafer may be an optical device wafer configured by forming optical devices, such as LEDs (light emitting diodes), on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. The wafer W is provided with a plurality of crossing division lines 11 (see FIG. 2), called streets, formed on the pattern side 1 thereof, thereby partitioning the wafer W into a plurality of rectangular regions where devices, such as those described previously, are respectively formed. These devices are formed in a device area 2 of the wafer W. In the case of a circular wafer W, this device area 2 is preferably circular and arranged concentrically with the outer circumference of the wafer W.

Figure 1:
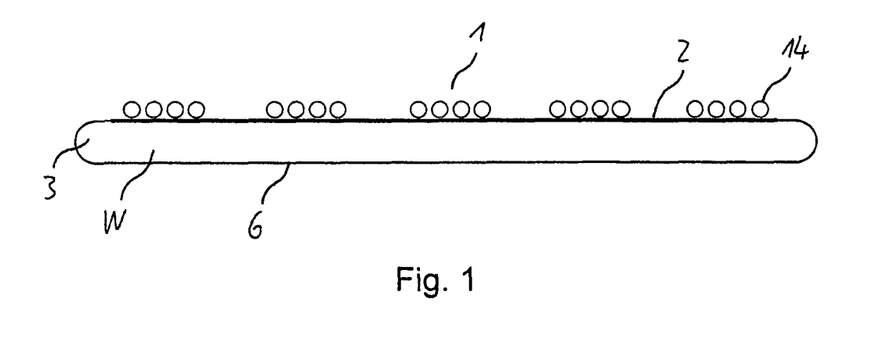
FIG. 1 is a cross-sectional view showing a wafer to be processed by the method of the present invention.
Figure 2:
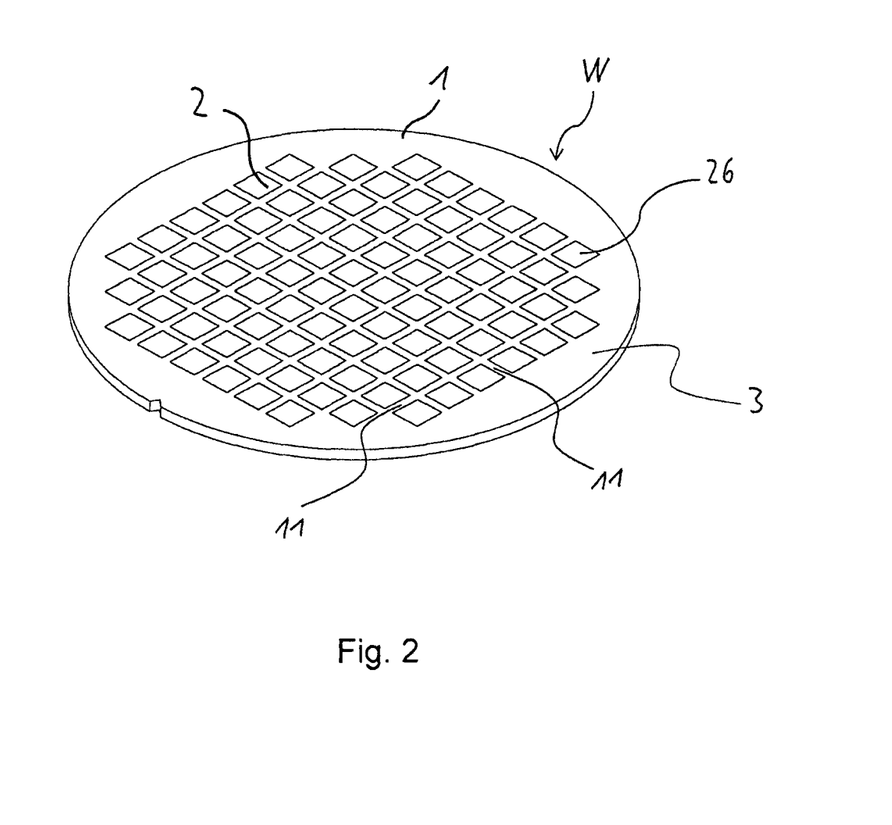
FIG. 2 is a perspective view of the wafer shown in FIG. 1.

The device area 2 is surrounded by an annular peripheral marginal area 3, as is schematically shown in FIGS. 1 and 2. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The device area 2 is formed with a plurality of protrusions 14 protruding from a plane surface of the wafer W, as is schematically shown, for example, in FIG. 1. The protrusions 14 may be, for example, bumps for establishing an electrical contact with the devices of the device area 2 in the separated dies. The height of the protrusions 14 in the thickness direction of the wafer W may be, for example, in the range of 20 to 200 μm.

In the following, a method of processing a wafer W according to a first embodiment of the present invention will be described with reference to FIGS. 1 to 11.

Figure 3:
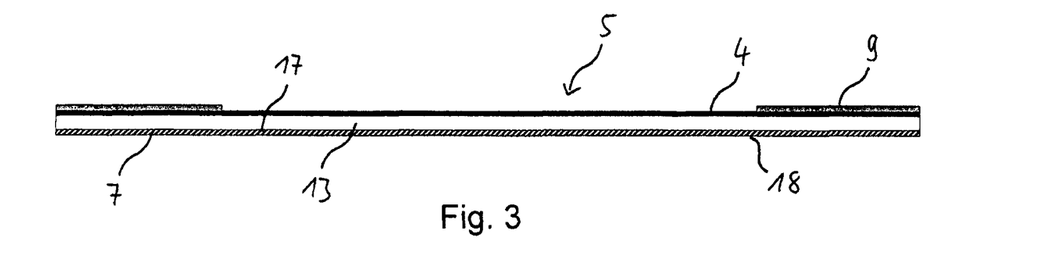
FIG. 3 is a cross-sectional view showing a protective sheeting a according to a first embodiment of the present invention.

FIG. 1 shows a cross-sectional view of the wafer W to be processed by the method of the present invention. FIG. 2 shows a perspective view of the wafer W shown in cross-section in FIG. 1. FIG. 3 shows a cross-sectional view of a protective sheeting 5 according to a first embodiment of the present invention.

As is shown in FIG. 3, the protective sheeting 5 comprises a base sheet 7, a cushioning layer 13 applied to a front surface 17 of the base sheet 7, a protective film 4, a back surface of which is attached to the cushioning layer 13, and an adhesive layer 9 applied to a part of a front surface of the protective film 4 opposite to the back surface thereof. Specifically, the adhesive layer 9 has an annular shape and is provided in a circumferential or peripheral portion of the front surface of the protective film 4.

Alternatively, the adhesive layer 9 may be provided over an entire contact area of the pattern side 1 of the wafer W and the protective film 4. In particular, the adhesive may be provided over an entire surface of the protective film 4 which is in contact with the pattern side 1 of the wafer W.

The base sheet 7 and the cushioning layer 13 have a substantially circular shape. The outer diameters of the base sheet 7 and the cushioning layer 13 are substantially identical to each other and to the outer diameter of the adhesive layer 9.

The base sheet 7 may, for example, have a thickness in the range of 500 to 1000 μm. The protective film 4 may have a thickness in the range of 5 to 200 μm. The cushioning layer may have a thickness in the range of 20 to 300 μm, preferably 80 to 200 μm.

The cushioning layer 13 is curable by an external stimulus, such as UV radiation, heat, an electric field and/or a chemical agent. In particular, the cushioning layer 13 may be formed of a curable resin, such as ResiFlat by DISCO Corporation or TEMPLOC by DENKA.

The protective sheeting 5 is formed by laminating the protective film 4 and the base sheet 7 having the cushioning layer 13 applied to the front surface 17 thereof.

Figure 4:
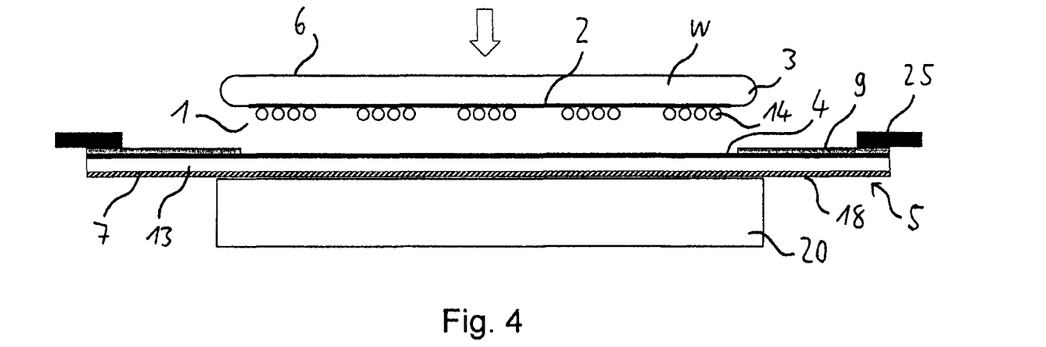
FIG. 4 is a cross-sectional view illustrating a step of attaching the protective sheeting shown in FIG. 3 to a wafer in a method of processing the wafer according to an embodiment of the present invention.

FIG. 4 illustrates a step of attaching the front surface of the protective film 4 to the pattern side 1 of the wafer W.

As is shown in FIG. 4, the annular adhesive layer 9 has an outer diameter which is larger than the inner diameter of an annular frame 25. Further, the annular adhesive layer 9 has an inner diameter which is smaller than the outer diameter of the wafer W but larger than the outer diameter of the device area 2. Hence, it can be reliably ensured that the adhesive of the adhesive layer 9 comes into contact only with the peripheral marginal area 3 of the wafer W.

Figure 6:
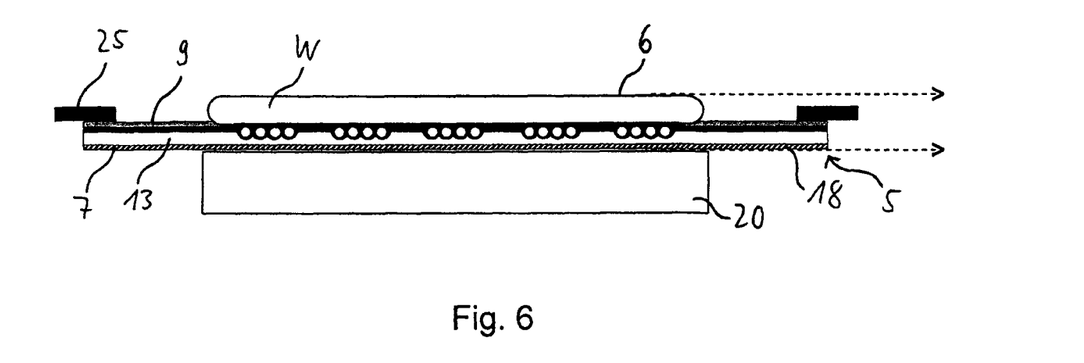
FIG. 6 is a cross-sectional view showing the outcome of the attachment step illustrated in FIG. 4.

Before attaching the protective sheeting 5 to the wafer W, a peripheral portion of the protective sheeting 5 is mounted on the annular frame 25. Further, a back surface 18 of the base sheet 7 opposite to the front surface 17 thereof is placed on a chuck table 20. Subsequently, as is indicated by an arrow in FIG. 4, the wafer W is attached to the protective sheeting 5 placed on the chuck table 20, thereby attaching the front surface of the protective film 4 to the pattern side 1 of the wafer W and adhering the protective film 4 to the peripheral marginal area 3 by the adhesive layer 9. Further, the protrusions 14 protruding from the plane surface of the wafer W are embedded in the cushioning layer 13, as is schematically shown in FIG. 6.

The protective film 4 covers the devices formed in the device area 2, including the protrusions 14, thus protecting the devices against damage or contamination. Further, the protective film 4 acts as an additional cushion or buffer in a subsequent grinding step, as will be detailed later.

The adhesive forming the adhesive layer 9 may be curable by an external stimulus, such as heat, UV radiation, an electric field and/or a chemical agent. In this way, the protective sheeting 5 can be particularly easily removed from the wafer W after processing.

In particular, the adhesive may be an acrylic resin or an epoxy resin. A preferred example of a UV curable-type resin for the adhesive is, e.g., urethane acrylate oligomer.

Further, the adhesive may be, for example, a water soluble resin.

For example, the protective film 4 may be made of a polymer material, such as PVC or EVA.

The protective film 4 is pliable and extendable to approximately three times its original diameter.

When attaching the wafer W to the protective sheeting 5, the protective film 4 is expanded, e.g., to approximately three times its original diameter, so as to closely follow the contours of the protrusions 14, as is schematically shown in FIG. 6.

The back surface 18 of the base sheet 7 is substantially parallel to the side 6 of the wafer W being opposite to the pattern side 1, i.e., the back side thereof, as is indicated by dashed arrows in FIG. 6.

Specifically, the wafer W and the protective sheeting 5 are pressed together by applying a parallel pressing force to the wafer back side 6 and the back surface 18 of the base sheet 7, for example, in a mounting chamber (not shown), so as to reliably embed the protrusions 14 in the cushioning layer 13 and achieve the substantially parallel alignment of base sheet back surface 18 and wafer back side 6. Details of pressing equipment and pressing operations suitable for this purpose are described in JP 5320058 B2 and JP 5324212 B2 for the case of using ResiFlat by the DISCO Corporation as a resin cushioning layer.

Figure 7:
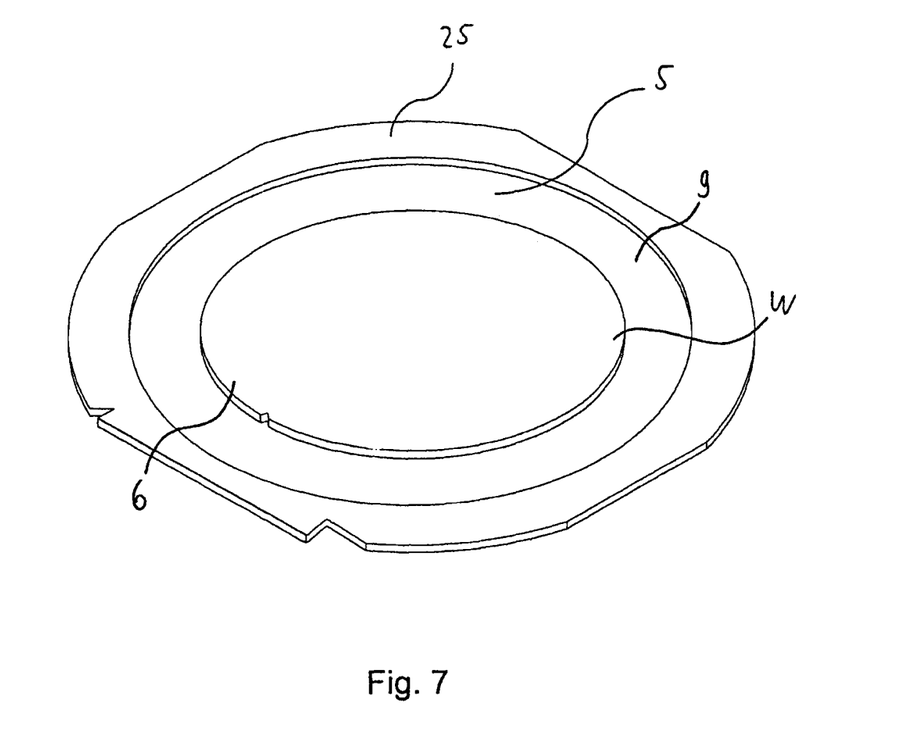
FIG. 7 is a perspective view of the arrangement of the wafer and the protective sheeting shown in FIG. 6.
Figure 8:
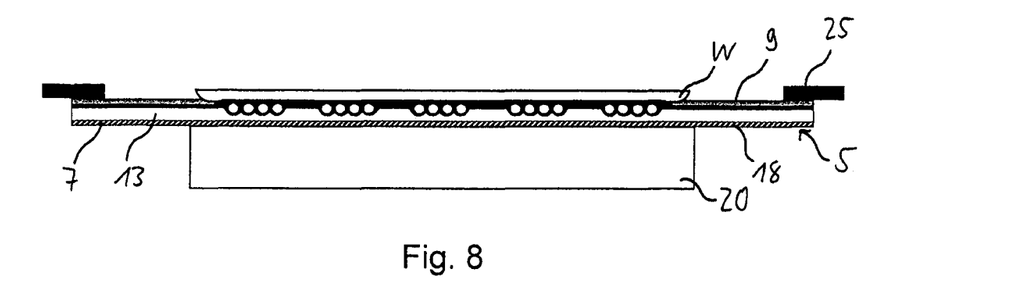
FIG. 8 is a cross-sectional view showing the outcome of a grinding step performed on the wafer shown in FIGS. 6 and 7.

By attaching the wafer W to the protective sheeting 5 in the manner described above, a wafer unit consisting of the wafer W, the protective film 4, the cushioning layer 13 and the base sheet 7 is formed, as is shown in FIGS. 6 and 7.

Figure 5:
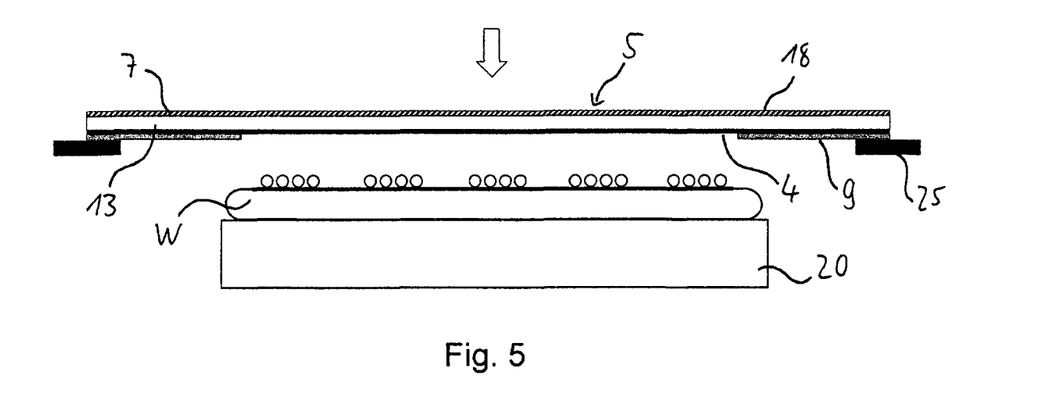
FIG. 5 is a cross-sectional view illustrating a step of attaching the protective sheeting shown in FIG. 3 to a wafer in a method of processing the wafer according to another embodiment of the present invention.

An alternative approach of attaching the wafer to the protective sheeting 5 is illustrated in FIG. 5.

Specifically, as is shown in this figure, the wafer back side 6 may be placed on the chuck table 20 so that the pattern side 1 is oriented upwards. Subsequently, the protective sheeting 5 may be attached to the pattern side 1 of the wafer W held on the chuck table 20, as is indicated by an arrow in FIG. 5, so that the protrusions 14 are embedded in the cushioning layer 13 and the back surface 18 of the base sheet 7 is substantially parallel to the back side 6 of the wafer W. This alternative step of attaching the wafer W and the protective sheeting 5 to each other can be carried out, for example, in a vacuum mounter, such as a vacuum chamber, e.g., the vacuum chamber described above.

After attaching the wafer W and the protective sheeting 5 to each other, the external stimulus is applied to the cushioning layer 13 so as to cure the cushioning layer 13. For example, for the case of a heat curable, e.g., thermosetting, cushioning layer 13, the cushioning layer 13 may be cured by heating in an oven. For the case of a UV curable cushioning layer 13, the cushioning layer 13 is cured by the application of UV radiation, e.g., through the base sheet 7, if a base sheet material is used which is transparent to this type of radiation, such as PET or glass.

Hence, the protrusions 14 are firmly held in the cured cushioning layer 13 and the substantially parallel relative alignment of the base sheet back surface 18 and the wafer back side 6 is particularly reliably maintained throughout the further processing.

It is to be noted, however, that the step of curing the cushioning layer 13 described above is optional. Alternatively, the cushioning layer 13 may be formed of a non-curable material, such as a non-curable adhesive, a non-curable resin or a non-curable gel, or the cushioning layer 13 may be formed of a curable material but not be cured in the method of processing the wafer W.

Subsequently, after the optional step of curing the cushioning layer 13, the back side 6 of the wafer W is ground for adjusting the wafer thickness in the state, in which the back surface 18 of the base sheet 7, which is a plane, flat surface, is placed on the top surface of the chuck table 20 (see FIG. 6). In the grinding process, the wafer thickness may be adjusted, for example, to a value in the range of approximately 30 to 100 µm. The thickness can be the final thickness of the dies 26 (see FIG. 2).

This grinding of the back side 6 of the wafer W may be performed using a grinding apparatus (not shown). The grinding apparatus may comprise a spindle housing, a spindle rotatably accommodated in the spindle housing and a grinding wheel mounted to the lower end of the spindle. A plurality of abrasive members may be fixed to the lower surface of the grinding wheel, wherein each abrasive member may be formed from a diamond abrasive member configured by fixing diamond abrasive grains with a bond, such as a metal bond or a resin bond. The grinding wheel having the abrasive members is rotated at high speeds by driving the spindle, e.g., using a motor.

In the grinding step, the chuck table 20 holding the wafer unit and the grinding wheel of the grinding apparatus are rotated and the grinding wheel is lowered so as to bring the abrasive members of the grinding wheel into contact with the back side 6 of the wafer W, thereby grinding the back side 6.

Since the plane back surface 18 of the base sheet 7, which is placed on the top surface of the chuck table 20 of the grinding apparatus, is substantially parallel to the back side 6 of the wafer W, the pressure applied to the wafer W by the grinding wheel during the grinding process is evenly and homogenously distributed over the wafer W. Hence, any risk of a pattern transfer or breakage of the wafer W can be minimised. Further, the substantially parallel alignment of the flat, even back surface 18 of the base sheet 7 and the back side 6 of the wafer W allows for the grinding step to be carried out with a high degree of precision, thus achieving a particularly uniform and homogenous wafer thickness after grinding.

The protective film 4 covers the devices formed in the device area 2 of the wafer W, therefore protecting the devices from damage and contamination, e.g., by residues of the material forming the cushioning layer 13. Moreover, the protective film 4 functions as an additional cushion or buffer between the pattern side 1 of the wafer W and the cushioning layer 13, thus further contributing to the uniform and homogeneous distribution of pressure during grinding. Therefore, a pattern transfer or breakage of the wafer W during the grinding process can be particularly reliably prevented.

Figure 9:
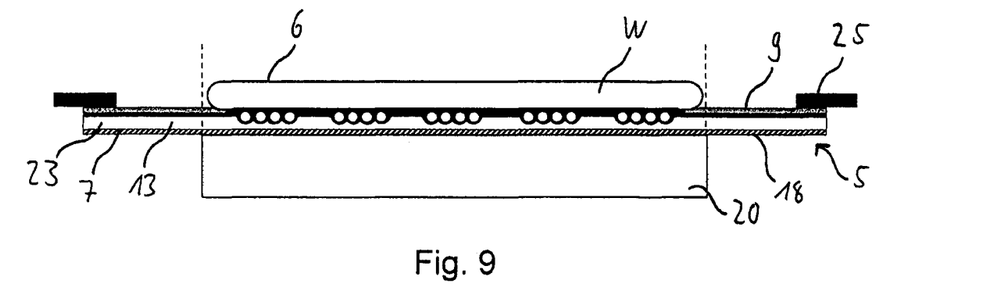
FIG. 9 is a cross-sectional view illustrating a step of cutting off a laterally extending portion of the protective sheeting shown in FIG. 6.
Figure 10:
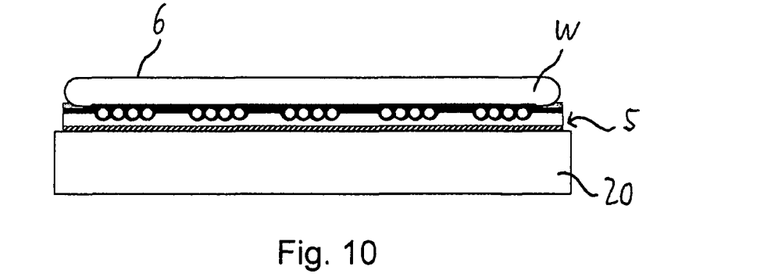
FIG. 10 is a cross-sectional view showing the outcome of the cutting step illustrated in FIG. 9.
Figure 11:
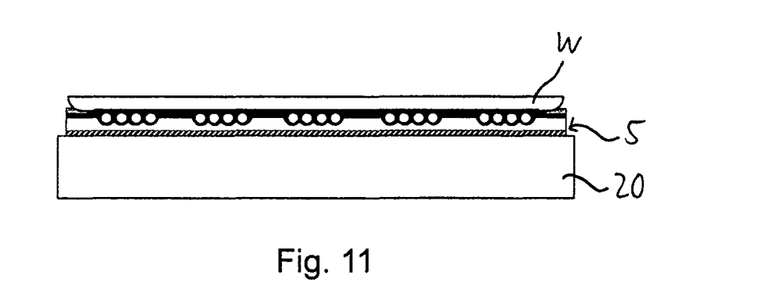
FIG. 11 is a cross-sectional view showing the outcome of a grinding step performed on the wafer shown in FIG. 10.
Figure 12:
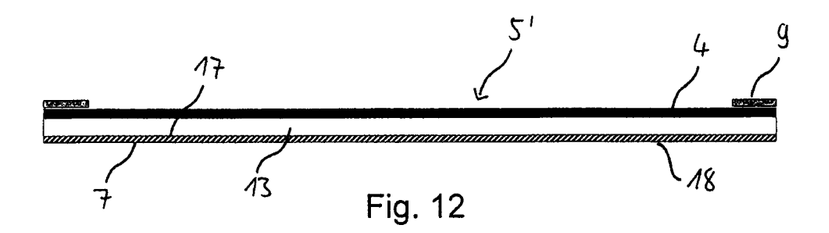
FIG. 12 is a cross-sectional view showing a protective sheeting according to a second embodiment of the present invention.

Optionally, before grinding the back side 6 of the wafer W, a portion 23 of the protective sheeting 5 which laterally extends beyond the circumference of the wafer W can be cut off, as is schematically shown in FIGS. 9 to 11.

Specifically, the step of cutting off the laterally extending portion 23 is indicated by dashed lines in FIG. 9. The portion 23 may be cut off, for example, by mechanical cutting, e.g., using a blade or a saw, by laser cutting or by plasma cutting. Cutting off the portion 23 facilitates handling of the wafer unit in the subsequent processing steps. The outcome of this cutting step is schematically shown in FIG. 10.

After cutting off the portion 23, the back side 6 of the wafer W may be ground in the same manner as described above, thus obtaining an arrangement of wafer W and protective sheeting 5 as shown in FIG. 11.

After the back side 6 of the wafer W has been ground, the wafer W may be subjected to further processing steps, such as cutting. As has been detailed above, cutting of the wafer W may be performed before or after removing the protective film 4, the cushioning layer 13 and the base sheet 7, i.e., the protective sheeting 5, from the wafer W. In the following, an embodiment will be explained in further detail in which the protective sheeting 5 is removed from the wafer W before cutting of the wafer W.

The cushioning layer 13 may exhibit a degree of compressibility, elasticity and/or flexibility, e.g., a rubber-like behavior, after curing, thus allowing for a particularly easy removal of the protective sheeting 5 from the wafer W. Alternatively or additionally, another external stimulus, such as hot water, may be applied to the cured cushioning layer 13 prior to removal of the protective sheeting 5, in order to soften the cured cushioning layer 13 for further facilitating the removal process.

If the adhesive layer 9 is curable by an external stimulus, such as UV radiation, heat, an electric field and/or a chemical agent, the external stimulus is applied to the adhesive layer 9, so as to lower the adhesive force thereof. In this way, the protective sheeting 5 can be removed from the wafer W in a particularly simple and reliable manner. Since the adhesive layer 9 is provided only in the peripheral marginal area 3, there is no risk of contamination of the devices formed in the device area 2 due to adhesive residues.

After the protective sheeting 5 has been removed from the wafer W, the wafer W may be cut along the division lines 11 from the pattern side 1 thereof, so as to fully separate the dies 26 (see FIG. 2) from each other. Cutting the wafer W may be performed by mechanical cutting, e.g., using a blade or a saw, and/or cutting by laser and/or cutting by plasma.

After the dies 26 have been completely separated from one another in the cutting step, they may be picked up by a pick-up device (not shown).

In the following, a method of processing a wafer W according to a second embodiment of the present invention will be described with reference to FIGS. 12 to 15.

The method of the second embodiment substantially differs from the method of the first embodiment in that no annular frame, such as the annular frame 25 shown in FIGS. 4 to 6, is used. The processing method of this second embodiment employs a protective sheeting 5' according to a second embodiment of the present invention (see FIG. 12) which differs from the protective sheeting 5 according to the first embodiment in that it has a smaller outer diameter.

Figure 13:
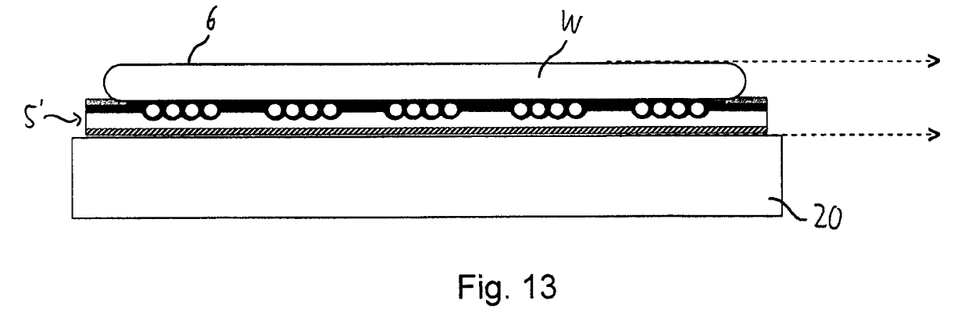
FIG. 13 is a cross-sectional view showing the outcome of a step of attaching the protective sheeting shown in FIG. 12 to a wafer in a method of processing the wafer according to another embodiment of the present invention.

Specifically, as is schematically shown in FIG. 13, the outer diameter of the protective sheeting 5' is only slightly larger, e.g., by 0.5 to 2.0 mm, than the outer diameter of the wafer W.

Alternatively, the outer diameter of the protective sheeting 5' may be substantially the same as the outer diameter of the wafer W.

Figure 14:
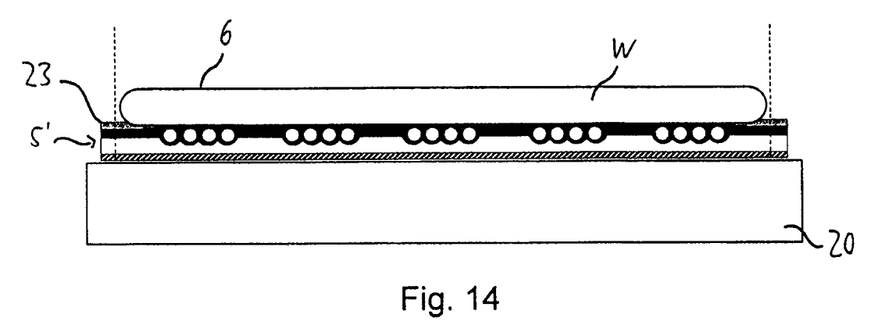
FIG. 14 is a cross-sectional view illustrating a step of cutting off laterally extending portions of the protective sheeting shown in FIG. 13.
Figure 15:
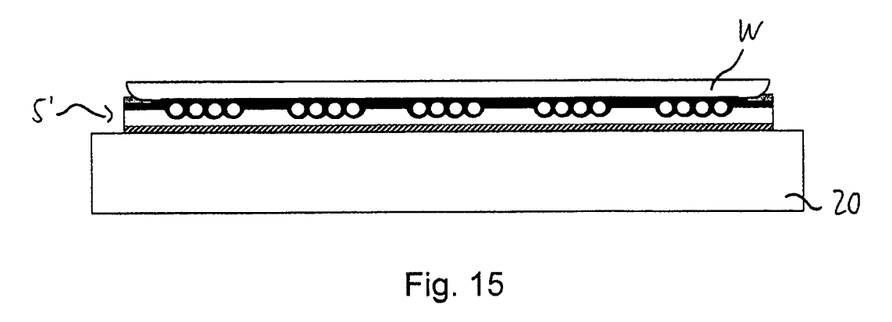
FIG. 15 is a cross-sectional view showing the outcome of a grinding step performed on the wafer shown in FIG. 14.

Otherwise, the processing steps shown in FIGS. 13 to 15 are substantially identical to those shown in FIGS. 6, 9 and 11, respectively.

Specifically, the wafer W is attached to the protective sheeting 5' first, so that the protective film 4 is adhered to the peripheral marginal area 3, the protrusions 14 are embedded in the cushioning layer 13 and the back surface 18 of the base sheet 7 is substantially parallel to the back side 6 of the wafer W, as is indicated by dashed arrows in FIG. 13. This attachment may be achieved by pressing together the wafer W and the protective sheeting 5' by applying a parallel pressing force to the wafer back side 6 and the back surface 18 of the base sheet 7, as has been detailed above. The back surface 18 is placed on the top surface of the chuck table 20 (see FIG. 13).

As an optional step, a portion 23 of the protective sheeting 5' laterally extending beyond the circumference of the wafer W may be cut off, before grinding the back side 6 of the wafer W. For example, the portion 23 may be cut off by mechanical cutting, e.g., using a blade or a saw, by laser cutting or by plasma cutting, as has been detailed above.

The optional step of cutting off portion 23 is indicated by dashed lines in FIG. 14.

Subsequently, the back side 6 of the wafer W is ground for adjusting the wafer thickness, e.g., to a value in the range of approximately 30 to 100 μm. The thickness can be the final thickness of the dies 26 (see FIG. 2). The grinding of the back side 6 of the wafer W may be performed in the same manner as described above for the method according to the first embodiment of the present invention. The outcome of grinding the back side 6 of the wafer W is schematically shown in FIG. 15.

Thereafter, the steps of cutting the wafer W and picking up the resulting dies 26 can be carried out in the same manner as detailed above.

The invention claimed is:

1. A method of processing a wafer, having on one side a device area with a plurality of devices, partitioned by a plurality of division lines, and a peripheral marginal area having no devices and being formed only around the device area, without extending to a central portion of the wafer, wherein the device area is formed with a plurality of protrusions protruding from a plane surface of the wafer and the method comprises:

providing a protective film;

providing a base sheet having a cushioning layer applied to a front surface thereof;

attaching a front surface of the protective film, for covering the devices on the wafer, to the one side of the wafer, wherein the protective film is adhered to at least the peripheral marginal area with an adhesive, the protective film being solid when applied;

wherein the adhesive is in direct contact with the protective film and the wafer, and the adhesive is curable by an external stimulus so as to lower an adhesive force of the adhesive;

attaching a back surface of the protective film opposite to the front surface thereof to the cushioning layer, wherein the protrusions protruding from the plane surface of the wafer are embedded in the cushioning layer and a back surface of the base sheet opposite to the front surface thereof is substantially parallel to the side of the wafer being opposite to the one side;

grinding the side of the wafer being opposite to the one side for adjusting the wafer thickness; and removing the protective film, the cushioning layer and the base sheet from the wafer, wherein the protective film, the cushioning layer and the base sheet are removed from the wafer together.

2. The method according to claim 1, wherein the protective film and the base sheet, having the cushioning layer applied to the front surface thereof, are laminated first, forming a protective sheeting comprising the base sheet, the cushioning layer and the protective film attached to the cushioning layer, and the protective sheeting) is subsequently attached to the one side of the wafer, such that the protrusions protruding from the plane surface of the wafer are covered by the protective film and embedded in the cushioning layer, and the back surface of the base sheet is substantially parallel to the side of the wafer being opposite to the one side.

3. The method according to claim 1, wherein the protective film is attached to the one side of the wafer first, and the one side of the wafer, having the protective film attached thereto, is subsequently attached to the front surface of the base sheet, so that the protrusions protruding from the plane surface of the wafer are embedded in the cushioning layer and the back surface of the base sheet is substantially parallel to the side of the wafer being opposite to the one side.

4. The method according to claim 1, further comprising cutting the wafer along the division lines.

5. The method according to claim 1, further comprising removing the protective film, the cushioning layer and the base sheet from the wafer.

6. The method according to claim 5 as dependent on claim 4, wherein the cutting of the wafer is performed before or after removing the protective film, the cushioning layer and the base sheet from the wafer.

7. The method according to claim 1, wherein the adhesive for adhering the protective film to the one side of the wafer is provided only in the peripheral marginal area or the adhesive is provided over an entire contact area of the one side of the wafer and the protective film.

8. The method according to claim 1, wherein the protective film is expandable and the protective film is expanded when it is attached to the one side of the wafer, so as to follow the contours of the protrusions protruding from the plane surface of the wafer.

9. The method according to claim 1, wherein the cushioning layer is curable by an external stimulus, such as UV radiation, heat, an electric field and/or a chemical agent.

10. The method according to claim 9, further comprising applying the external stimulus to the cushioning layer so as to cure the cushioning layer, before grinding the side of the wafer being opposite to the one side.

11. The method according to claim 1, further comprising cutting off a portion or portions of the protective film and/or the cushioning layer and/or the base sheet which laterally extends or extend beyond a circumference of the wafer, before grinding the side of the wafer being opposite to the one side.

12. The method according to claim 1, wherein the base sheet is made of a rigid material, such as PET and/or silicon and/or glass and/or SUS.

13. The method according to claim 1, wherein the protective film has a thickness in the range of 5 to 200 μm.

14. The method according to claim 1, wherein the cushioning layer has a thickness in the range of 20 to 300 μm.

15. A protective sheeting for use in processing a wafer, the protective sheeting comprising:

a base sheet;

a cushioning layer applied to a front surface of the base sheet;

a protective film, a back surface of which is attached to the cushioning layer; and an adhesive layer applied to at least part of a front surface of the protective film opposite to the back surface thereof, wherein the adhesive layer is curable by an external stimulus so as to lower an adhesive force of the adhesive layer, wherein the protective sheeting is configured to be attachable to the wafer, the protective sheeting being further configured to be removable from the wafer by removing the protective film, the cushioning layer and the base sheet from the wafer together.

16. The protective sheeting according to claim 15, wherein the cushioning layer is curable by an external stimulus, such as UV radiation, heat, an electric field and/or a chemical agent.

17. The protective sheeting according to claim 15, wherein the adhesive layer has a substantially annular shape.

18. The protective sheeting according to claim 17, wherein the outer diameter of the adhesive layer is larger than the inner diameter of a semiconductor-sized annular frame for holding a semiconductor-sized wafer.

19. The protective sheeting according to claim 17, wherein the inner diameter of the adhesive layer is smaller than the diameter of a semiconductor-sized wafer.

* * * * *